United States Patent
Huang et al.

(10) Patent No.: US 7,154,176 B2
(45) Date of Patent: Dec. 26, 2006

(54) CONDUCTIVE BUMPS WITH NON-CONDUCTIVE JUXTAPOSED SIDEWALLS

(75) Inventors: Yuan-Chang Huang, Banchian (TW); Shyh-Ming Chang, Hsinchu (TW); Su-Chia Lu, Tangluo Township, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 9 days.

(21) Appl. No.: 10/714,277

(22) Filed: Nov. 14, 2003

(65) Prior Publication Data

US 2005/0104223 A1    May 19, 2005

(51) Int. Cl.
*H01L 23/52* (2006.01)
*H01L 23/48* (2006.01)

(52) U.S. Cl. .................. 257/737; 257/734; 257/748
(58) Field of Classification Search ............... 257/737, 257/734, 748
See application file for complete search history.

(56) References Cited

U.S. PATENT DOCUMENTS

| | | | |
|---|---|---|---|
| 6,333,555 B1 * | 12/2001 | Farnworth et al. | 257/737 |
| 6,767,818 B1 * | 7/2004 | Chang et al. | 438/613 |
| 2003/0183933 A1 * | 10/2003 | Kobayashi | 257/737 |
| 2004/0219715 A1 * | 11/2004 | Kwon et al. | 438/106 |

* cited by examiner

*Primary Examiner*—Zandra V. Smith
*Assistant Examiner*—Kiesha Rose
(74) *Attorney, Agent, or Firm*—Akin Gump Strauss Hauer & Feld, LLP

(57) ABSTRACT

A microelectronic structure having a substrate of multiple conductive bumps for contact with bond pads on an electronic substrate in the fabrication of a flip chip electronic assembly. Each of the conductive bumps includes a conductive layer which is absent from at least one sidewall of the bump to prevent the inadvertent formation of a short-circuiting electrical path between adjacent conductive bumps in the electronic assembly.

27 Claims, 4 Drawing Sheets

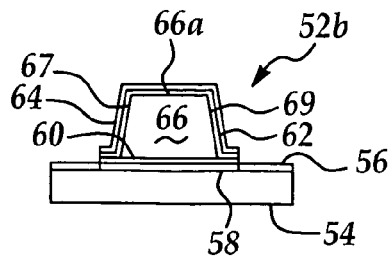
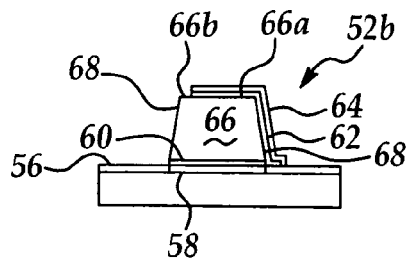
*Figure 4A*  *Figure 4B*
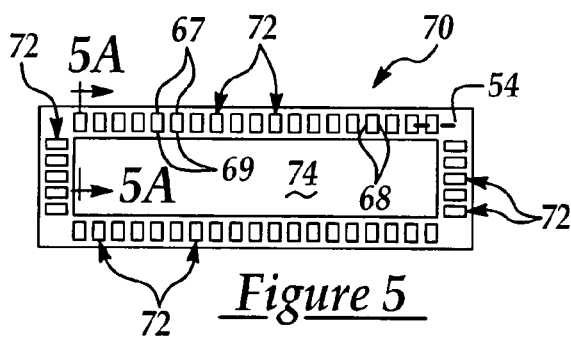
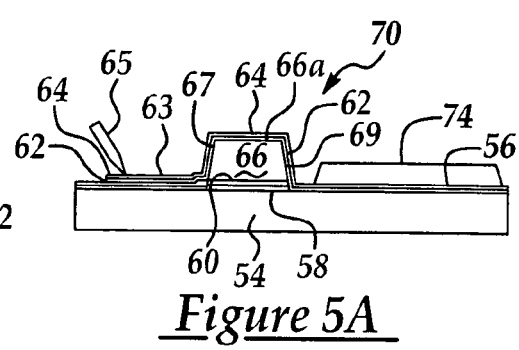
*Figure 5*  *Figure 5A*
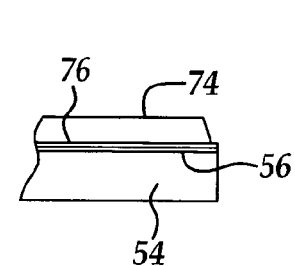
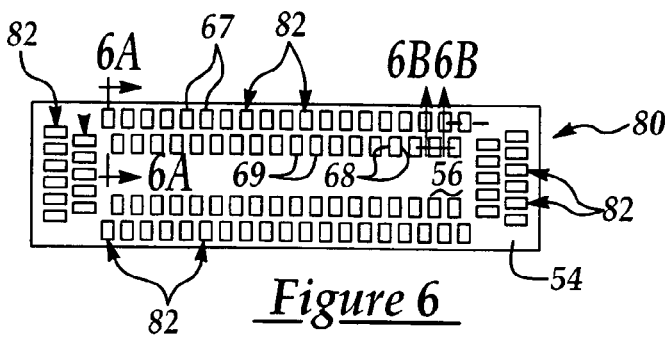
*Figure 5B*  *Figure 6*
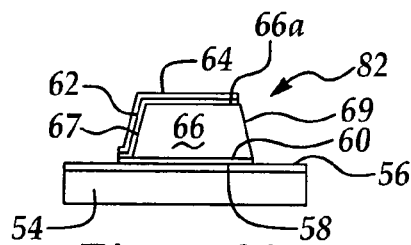
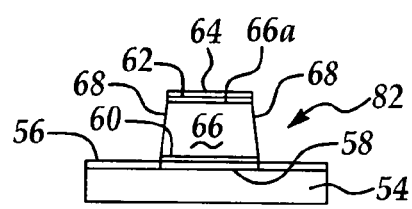
*Figure 6A*  *Figure 6B*
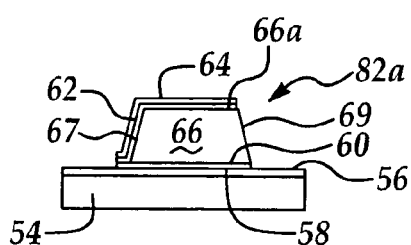
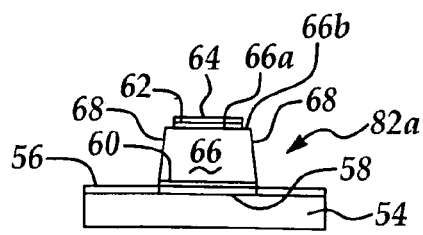
*Figure 7A*  *Figure 7B*

US 7,154,176 B2

CONDUCTIVE BUMPS WITH NON-CONDUCTIVE JUXTAPOSED SIDEWALLS

FIELD OF THE INVENTION

The present invention generally relates to a microelectronic structure that is provided with conductive bumps on a surface for making electrical connection with other substrates and more particularly, relates to a microelectronic structure that is provided with conductive bumps each having a non-conductive sidewall that faces a non-conductive sidewall of an adjacent bump for making electrical communication with bond pads on another substrate such as to eliminate the possibility of an electrical short between adjacent bumps. The invention further provides a method for fabricating the microelectronic structure that is provided with the conductive bumps.

BACKGROUND OF THE INVENTION

In the recent development of integrated circuit (IC) chip mounting technologies, an IC chip is frequently bonded to another electronic substrate by establishing electrical communication between conductive bumps built on the IC chip and bond pads provided on the electronic substrate. When such bonding technique is used, an anisotropic conductive film (ACF) is frequently provided between the IC chip and the electronic substrate such that electrically conductive particles embedded in the ACF provide such electrical communication.

Referring initially to FIGS. 1A–1C, a typical process for bonding a microelectronic structure to an electronic substrate is shown. The microelectronic structure 10 is provided with multiple, electrically-conductive bumps 12 formed on a top surface for providing electrical communication to microelectronic circuits (not shown) in the microelectronic structure 10. The conductive bump 12 is built on a bond pad 14 and a seed layer 16, and is insulated by a dielectric layer 18. The electronic substrate 20, on the other hand, is provided with multiple bond pads 22 formed on a top surface 24. The electronic substrate 20 may be a printed circuit board, Si substrate or glass substrate, for example. An anisotropic conductive film 30 that has multiple, electrically-conductive particles 32 embedded in an electrically-insulating material 34 is positioned on the top surface 24 of the electronic substrate 20.

After the microelectronic structure 10, the electronic substrate 20 and the ACF 30 are placed in heated bonding equipment and a suitable pressure is applied to press the microelectronic structure 10 against the electronic substrate 20, an electronic assembly 40 is formed which is shown in FIG. 1C. As seen in FIG. 1C, electrical communication between the microelectronic structure 10 and the electronic substrate 20 is established by electrically-conductive particles 32a, 32b and 32c which provide electrical conductance between the conductive bumps 12 and the bond pads 22.

The bonding method by using ACF can be efficient and low cost. However, since the distribution of the electrically-conductive particles 32 cannot be controlled in an orderly manner when it is dispersed and embedded in the insulating material 34, a cluster of the electrically-conductive particles 32 frequently occurs which may cause an undesirable electrical short between adjacent conductive bumps 12. This is shown in FIG. 1D. While the electrically-conductive particles 32a, 32b and 32c provide desirable electrical communication between the conductive bumps 12 and the bond pads 22, the electrically-conductive particles 32d also cause undesirable electrical shorting between the two adjacent conductive bumps 12. When such electrical shorting occurs, the electronic circuits in the microelectronic structure 10 may be damaged or otherwise become non-functional. Such electrical shorting, therefore, must be avoided.

As one solution to the problem, ACF suppliers have developed an ACF film that exhibits a controlled pattern of distribution of the electrically-conductive particles in the insulating material. However, such tightly-controlled distribution ACF films are produced at very high cost, and therefore, render impractical bonding techniques using the film.

It is therefore an object of the present invention to provide conductive bumps and a method of fabricating conductive bumps having at least one non-conductive sidewall, outer wall or inner wall to prevent electrical bridging between adjacent conductive bumps on a substrate.

It is another object of the present invention to provide conductive bumps each of which includes at least one non-conductive sidewall, outer wall or inner wall that faces an adjacent conductive bump to prevent electrical bridging between adjacent conductive bumps.

Still another object of the present invention is to provide multiple conductive bumps on an IC chip, each of which conductive bumps includes at least one sidewall, outer wall or inner wall covered with a conductive layer to provide electrical conductance between the IC chip and an electronic substrate bonded to the IC chip, and at least one sidewall, outer wall or inner wall which remains uncovered by a conductive layer to prevent electrical bridging between adjacent conductive bumps and short-circuiting of the chip.

Yet another object of the present invention is to provide multiple conductive bumps each of which includes at least one non-conductive sidewall, outer wall or inner wall that faces an adjacent conductive bump on an IC chip and may be provided with a test probe pad for the test probing of the conductive bumps on the chip.

A still further object of the present invention is to provide an IC chip that includes multiple conductive bumps each of which is provided with at least one non-conductive sidewall, outer wall or inner wall and is applicable to fabrication of both ACF flip-chip electronic assemblies and NCF (Non-Conductive Film) flip-chip electronic assemblies.

Yet another object of the present invention is to provide a method of fabricating an IC chip which includes multiple conductive bumps each of which includes at least one non-conductive sidewall, outer wall or inner wall which stands juxtaposed to an adjacent conductive bump to prevent electrical conductance between the bumps and short-circuiting of the chip.

SUMMARY OF THE INVENTION

In accordance with these and other objects and advantages, the present invention is generally directed to conductive bumps which are fabricated on an IC chip substrate that is then typically inverted to form a "flip chip" wherein the bumps are bonded to respective bond pads on an electronic substrate, such as a printed circuit board, Si substrate or glass substrate, in the fabrication of flip-chip electronic assemblies. At least one outer wall, inner wall or sidewall of each conductive bump which is adjacent to a juxtaposed conductive bump, is non-conductive. Each conductive bump is fabricated in such a manner that a conductive metal layer on the bump uncovers at least one wall of the bump while covering at least one or all of the remaining walls of the bump. Accordingly, conductive particles deposited in an anisotropic conductive film (ACF), for example, surrounding the bumps in fabrication of the electronic assembly are incapable of bridging conductive layers of adjacent conductive bumps to short-circuit the IC chip.

The present invention further includes a novel method for the fabrication of conductive bumps each having at least one non-conductive outer wall, sidewall or inner wall, on a substrate in facing relationship to an adjacent conductive bump. The method includes providing a substrate having multiple bond pads each provided in contact with integrated circuits previously fabricated on the substrate; providing an adhesion layer on the substrate, over each bond pad; depositing a bump-forming layer on the adhesion layer; developing or etching the bump-forming layer to define the support structure for the conductive bump; depositing an adhesion layer on the etched bump-forming layer; depositing a conductive layer on the adhesion layer; coating and patterning a photoresist layer on the conductive layer; etching the conductive layer to remove the conductive layer from at least one of the walls on the bump; and etching the adhesion layer and stripping the photoresist layer from the conductive bump.

SUMMARY OF THE INVENTION

The invention will now be described, by way of example, with reference to the accompanying drawings, in which:

FIGS. 4A and 4B are cross-sectional views, taken along section lines A—A and B—B, respectively, in FIG. 2, of conductive bumps of still another embodiment of the invention;

FIG. 5 is a top view of a microelectronic structure with multiple conductive bumps provided thereon in accordance with another embodiment of the present invention;

FIG. 5A is a cross-sectional view taken along section lines A—A in FIG. 5, of a conductive bump in accordance with the present invention;

FIG. 5B is an alternative embodiment of the invention taken along section lines A—A in FIG. 5;

FIG. 6 is a top view of a microelectronic structure with multiple conductive bumps provided thereon in accordance with yet another embodiment of the invention;

FIGS. 6A and 6B are cross-sectional views taken along section lines A—A and B—B, respectively, of conductive bumps in FIG. 6;

FIGS. 7A and 7B are cross-sectional views taken along section lines A—A and B—B, respectively, in FIG. 6, of conductive bumps in accordance with another embodiment of the invention;

Figure 10:
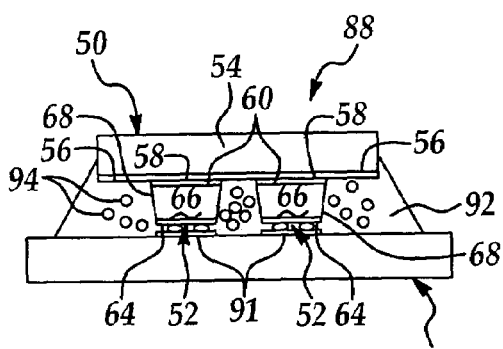
Figure 11:
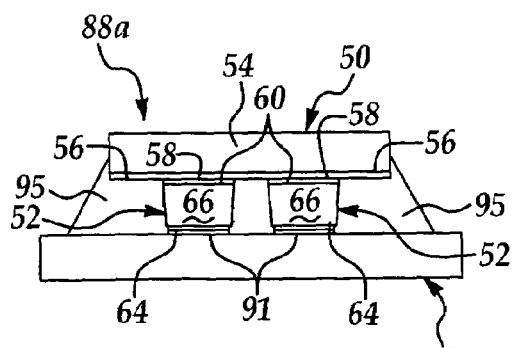

FIG. 10 is a cross-sectional view of a flip-chip electronic assembly fabricated by bonding a microelectronic structure, having multiple conductive bumps thereon according to the present invention, to an electronic substrate and providing an anisotropic conductive film (ACF) having conductive particles as the electrically-conductive medium between the micro-electronic substrate and the electronic substrate;

FIG. 11 is a cross-sectional view of a flip-chip electronic assembly fabricated by bonding a microelectronic structure, having multiple conductive bumps fabricated thereon according to the present invention, to an electronic substrate and providing a non-conductive film (NCF) between the microelectronic substrate and the electronic substrate; and FIGS. 12A–12I are cross-sectional views illustrating sequential fabrication of a conductive bump on an IC chip substrate according to the method of the present invention.

DETAILED DESCRIPTION OF THE INVENTION

The present invention is generally directed to conductive bumps which are fabricated on an IC chip substrate to form a microelectronic structure that is then typically inverted and bonded to an electronic substrate to fabricate a flip-chip electronic assembly. In one embodiment, the conductive bumps are provided in electrical contact with respective bond pads on an electronic substrate, such as a printed circuit board, Si substrate or glass substrate, for example, through conductive particles enmeshed in an anisotropic conductive film (ACF). In another embodiment, the conductive bumps on the IC chip or microelectronic structure are provided in direct contact with the respective bond pads on the electronic substrate. A non-conductive film (NCF) is sandwiched between the microelectronic structure and the electronic substrate.

In accordance with the present invention, at least one outer wall, inner wall or sidewall of each conductive bump which is adjacent to a juxtaposed conductive bump, is non-conductive. Each conductive bump is fabricated in such a manner that a conductive metal layer on the bump uncovers at least one wall of the bump while covering at least one or all of the remaining walls of the bump. Accordingly, conductive particles deposited in an anisotropic conductive film (ACF), for example, surrounding the bumps in fabrication of the electronic assembly are incapable of inadvertently bridging conductive layers on adjacent conductive bumps to short-circuit the microelectronic structure.

The present invention further includes a novel method for the fabrication of conductive bumps each having at least one non-conductive outer wall, sidewall or inner wall, on a substrate in facing relationship to an adjacent conductive bump. The method includes providing a substrate having multiple bond pads each provided in contact with integrated circuits previously fabricated on the substrate; providing an adhesion layer on the substrate, over each bond pad; depositing a bump-forming layer on the adhesion layer; developing or etching the bump-forming layer to define the support structure for the conductive bump; depositing an adhesion layer on the etched bump-forming layer; depositing a conductive layer on the adhesion layer; coating and patterning a photoresist layer on the conductive layer; etching the conductive layer to remove the conductive layer from at least one of the walls on the bump; and etching the adhesion layer and stripping the photoresist layer from the conductive bump.

Figures 1A, 1B, 1C:
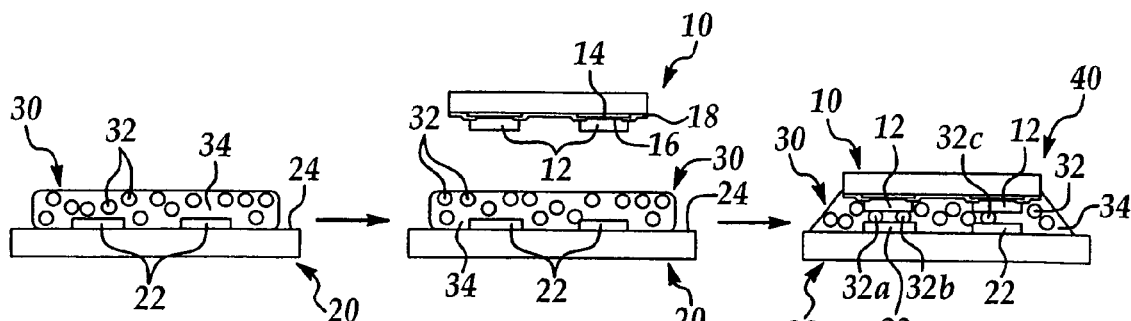
FIGS. 1A–1D are enlarged, cross-sectional views illustrating a conventional bonding process for mounting a microelectronic structure to an electronic substrate by using an isotropic conductive film.
Figure 1D:
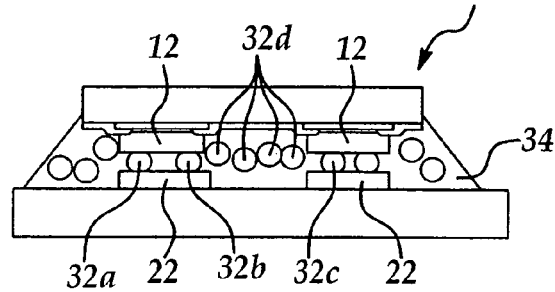
Figure 2:
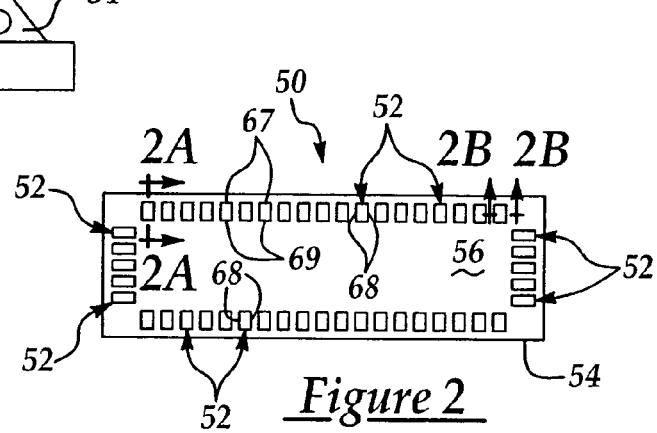
FIG. 2 is a top view of an IC chip or microelectronic structure with multiple conductive bumps provided thereon in accordance with one embodiment of the present invention.
Figure 2A:
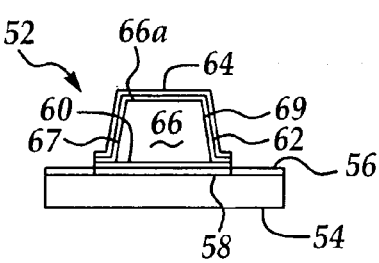
FIGS. 2A and 2B are cross-sectional views taken along section lines A—A and B—B, respectively, of a conductive bump on the microelectronic structure in FIG. 2.
Figure 2B:
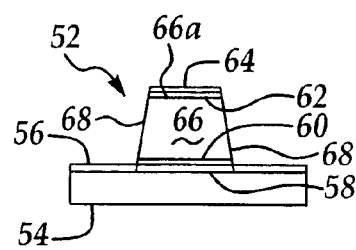

Referring initially to FIGS. 2–2B, an integrated circuit (IC) chip or microelectronic device 50 according to a first embodiment of the present invention includes a substrate 54 on which is fabricated multiple conductive bumps 52 in a selected pattern. The adjacent conductive bumps 52 are typically arranged in rows next to the respective edges of the substrate 54. Each of the conductive bumps 52 is provided in electrical contact with an IC device (not shown) previously fabricated on the substrate 54 using sequential IC fabrication process steps.

As shown in the cross-sectional views of FIGS. 2A and 2B, a passivation layer 56 typically covers the surface of the substrate 54. A metal bond pad 58 is provided in electrical contact with IC devices (not shown) previously fabricated on the substrate 54. Each conductive bump 52 typically includes an adhesive layer of under-bump metal (UBM) 60 which is deposited on the bond pad 58, such as by using CVD or PVD techniques.

A bump-forming layer 66, which is typically polyimide (PI) or other electrically insulative material, is deposited on the UBM 60 and then patterned and etched to define the basic shape for the conductive bump 52. As shown in FIGS. 2 and 2A, each conductive bump 52 includes an outer wall 67 that faces outwardly from the chip 50 and an inner wall 69 that faces the center of the chip 50. As shown in FIGS. 2 and 2B, each conductive bump 52 further includes sidewalls 68 that are positioned adjacent to the sidewalls 68 of the juxtaposed conductive bump 52 on the chip 50.

An adhesion layer 62 is deposited on the bump-forming layer 66, and a metal conductive layer 64 is deposited on the adhesion layer 62. The conductive layer 64 may be any suitable electrically-conductive metal such as Au, Ag, Pt, Pd, Al, Cu, Sn and alloys thereof, for example. The adhesion layer 62 promotes adhesion between the conductive layer 64 and the underlying bump-forming layer 66. As further shown in FIG. 2A, in the finished conductive bump 52, the adhesion layer 62 and the conductive layer 64 cover both the outer wall 67 and the inner wall 69, as well as the upper surface 66a, of the bump-shaped bump-forming layer 66. As shown in FIG. 2B, however, both of the sidewalls 68 of the bump-forming layer 66 remain exposed and uncovered by the adhesion layer 62 and the conductive layer 64. Both the adhesion layer 62 and the conductive layer 64 are typically etched from the sidewalls 68 of each conductive bump 52. Accordingly, because the sidewalls 68 of each conductive bump 52 remain uncovered or exposed by the conductive layer 64, inadvertent electrical conductance between the sidewalls 68 of adjacent conductive bumps 52 in the fabricated electronic assembly 88 (FIG. 10) is prevented, as hereinafter further described.

Figure 3A:
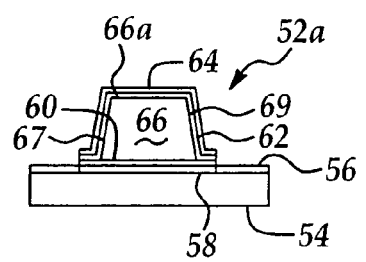
FIGS. 3A and 3B are cross-sectional views, taken along section lines A—A and B—B, respectively, in FIG. 2, of a conductive bump of another embodiment of the invention.
Figure 3B:
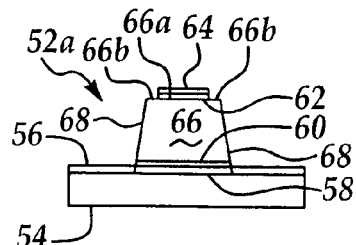

Referring next to FIGS. 3A and 3B, in another embodiment of the invention the conductive layer 64 covers the upper surface 66a, outer wall 67 and inner wall 69 of each conductive bump 52a as viewed in the cross-section A—A of FIG. 2A. When viewed in the cross-section B—B of FIG. 2B, however, the conductive layer 64 and underlying adhesion layer 62 do not cover the sidewalls 68 of each conductive bump 52a, leaving the bump-forming layer 66 exposed on the respective sidewalls 68. Furthermore, each conductive layer 64 and adhesion layer 62 on the upper surface 66a are etched to define at least one shoulder 66b which is uncovered by the conductive layer 64 and adhesion layer 62 at the edges of the upper surface 66a.

Referring next to FIGS. 4A and 4B, in still another embodiment of the invention the conductive layer 64 covers the upper surface 66a, outer wall 67 and inner wall 69 of each conductive bump 52b as viewed in the cross-section A—A of FIG. 2A. As shown in FIG. 4B, each conductive bump 52b includes one exposed sidewall 68, from which the adhesion layer 62 and conductive layer 64 are omitted, and one covered sidewall 68 on which is provided the adhesion layer 62 and the conductive layer 64. A shoulder 66b may be provided in the adhesion layer 62 and conductive layer 64, at an edge of the upper surface 66a of the conductive bump 52b.

Referring next to FIGS. 5–5B, in another embodiment multiple conductive bumps 72 are provided on a substrate 54 in rows which extend along the edges of the substrate to define an IC chip or microelectronic structure 70. A protection layer 74 is deposited on the substrate 54, between the rows of conductive bumps 72 to protect the passivation layer 56 from inadvertently becoming scratched in the finished electronic device. As shown in FIG. 5A, an adhesion layer 62 and a conductive layer 64 cover both the outer wall 67 and the inner wall 69 of each conductive bump 67, whereas either or both of the sidewalls 68 (FIG. 4B) of each conductive bump 72 are exposed and uncovered. The adhesion layer 62 and conductive layer 64 may extend from the conductive bump 72, onto the adjacent substrate 54 to define a test probe pad 63 which may be contacted by a test probe 65 for testing of the microelectronic structure 70, according to the knowledge of those skilled in the art. As shown in FIG. 5B, in an alternative embodiment a metal shielding layer 76 is provided on the passivation layer 56, and the protection layer 74 is provided on the metal shielding layer 76.

Referring next to FIGS. 6–6B, in still another embodiment of the invention, multiple conductive bumps 82 are provided on a substrate 54 and are arranged in staggered relationship to each other in two adjacent rows next to the respective edges of the substrate 54, to define a microelectronic device 80. As shown in FIG. 6A, the outer wall 67, as well as the upper surface 66a, of each conductive bump 82 is typically covered by an adhesion layer 62 and a conductive layer 64, whereas the inner wall 69 of each conductive bump 82 is exposed and uncovered by the adhesion layer 62 and conductive layer 64. As shown in FIG. 6B, both sidewalls 68 of each conductive bump 82 are exposed and uncovered by the adhesion layer 62 and conductive layer 64.

Referring next to FIGS. 7A and 7B, in yet another embodiment each of the conductive bumps 82a includes at least one shoulder 66b provided in the conductive layer 64 and underlying adhesion layer 62, at the edges of the upper surface 66a, as shown in FIG. 7B. As shown in FIG. 7A, when viewed along the cross-section A—A in FIG 6, the adhesion layer 62 and overlying conductive layer 64 cover both the upper surface 66a and the outer wall 67 of each conductive bump 82a, whereas the inner wall 69 remains uncovered and exposed.

Figure 8A:
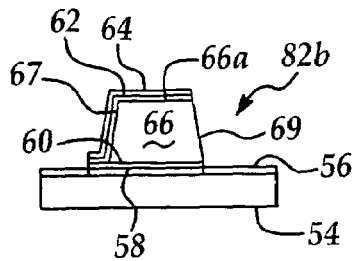
FIGS. 8A and 8B are cross-sectional views taken along section lines A—A and B—B, respectively, in FIG. 6, illustrating still another embodiment of the invention.
Figure 8B:
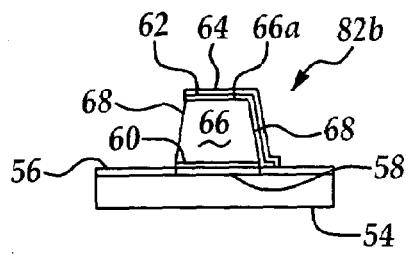

Referring next to FIGS. 8A and 8B, in another embodiment the upper surface 66a and outer wall 67 of each conductive bump 82b are covered by the adhesion layer 62 and conductive layer 64, whereas the inner wall 69 remains uncovered and exposed, as shown in FIG. 8A. One sidewall 68 is covered by the adhesion layer 62 and the conductive layer 64, and the other sidewall 68 is uncovered and exposed, as shown in FIG. 8B.

Figure 9:
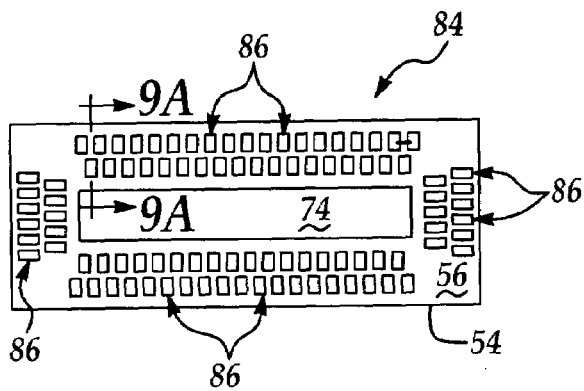
FIG. 9 is a top view of a microelectronic structure with multiple conductive bumps provided thereon in accordance with still another embodiment of the invention.
Figure 9A:
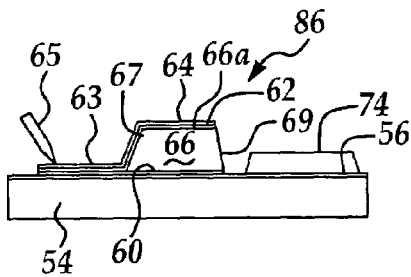
FIG. 9A is a cross-sectional view, taken along section lines A—A in FIG. 9.
Figure 9B:
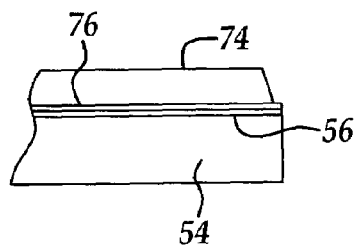
FIG. 9B is a cross-sectional view, taken along section lines A—A in FIG. 9, illustrating an alternative embodiment of the invention.

Referring next to FIGS. 9–9B, in another embodiment multiple conductive bumps 86 are provided on a substrate 54 in two rows which extend along the respective edges of the substrate 54 to define an IC chip or microelectronic structure 84. An elongated protection layer 74 is deposited on the substrate 54, between the rows of conductive bumps 86, to protect the passivation layer 56 from inadvertently becoming scratched in the finished electronic device. As shown in FIG. 9A, an adhesion layer 62 and a conductive layer 64 cover both the outer wall 67 and the upper surface 66a of each conductive bump 86, whereas the inner wall 69 of each conductive bump 86, as well as either or both of the sidewalls 68 (FIG. 8B) of each conductive bump 86, are exposed. The adhesion layer 62 and conductive layer 64 may extend from the conductive bump 86 onto the adjacent substrate 54 to define a test probe pad 63 which may be contacted by a test probe 65 for testing of the microelectronic structure 84. As shown in FIG. 9B, in an alternative embodiment a metal shielding layer 76 is provided on the passivation layer 56, and the protection layer 74 is provided on the metal shielding layer 76.

Referring next to FIG. 10, a flip-chip electronic assembly 88, fabricated using a microelectronic structure 50 having multiple conductive bumps 52 as heretofore described with respect to the invention of FIGS. 2–2B, is shown. Through one or multiple conductive particles 94 dispersed in an anisotropic conducting film (ACF) 92, each conductive bump 52 is provided in electrical contact with a metal bond pad 91 provided on an electronic substrate 90, such as a printed circuit board, Si substrate or glass substrate, for example. The ACF 92 is sandwiched between the microelectronic structure 50 and the electronic substrate 90. Because the sidewalls 68 of each conductive bump 52 lack the conductive layer 64 (FIG. 2B), which is confined to the upper surface 66a, the outer wall 67 and the inner wall 69 of the conductive bump 52, as shown in FIG. 2A, the conductive particles 94 are incapable of forming an electrical path between adjacent conductive bumps 52 and short-circuiting the electronic assembly 88.

FIG. 11 illustrates a flip-chip electronic assembly 88a of alternative design, wherein each conductive bump 52 on the microelectronic structure 50 is provided in direct electrical contact with a bond pad 91 on an electronic substrate 90. A non-conductive film (NCF) 95 is sandwiched between the microelectronic device 50 and the electronic substrate 90.

Figure 12A:
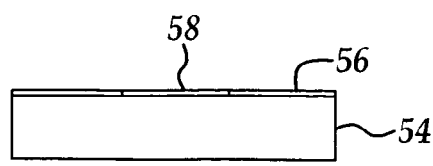

An illustrative method of fabricating a microelectronic substrate 52a according to the present invention is shown in FIGS. 12A–12I. As shown in FIG. 12A, a passivation layer 56 is initially deposited on the substrate 54. A metal bond pad 58 is embedded in the passivation layer 56. The bond pad 58 is provided in electrical contact with an IC device (not shown) previously fabricated on the substrate 54.

Figure 12B:
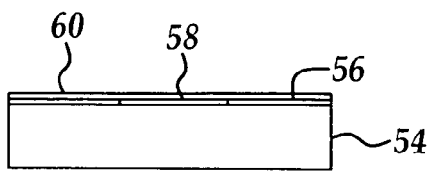

As shown in FIG. 12B, a layer of under-bump metal (UBM) 60 is deposited on the passivation layer 56 and the bond pad 58. The UBM 60 may be formed using CVD or PVD techniques, for example. The UBM 60 provides an adhesion layer for the conductive bump 52a subsequently fabricated thereon.

Figure 12C:
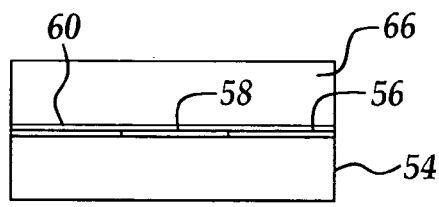
Figure 12D:
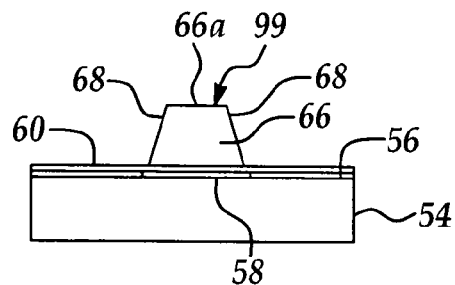

As shown in FIG. 12C, a bump-forming layer 66, which is typically a non-conductive material such as polyimide (PI), is deposited on the UBM 60. The bump-forming layer 66 is typically spin-coated on the UBM 60, although other techniques may be used for the purpose. The bump-forming layer 66 forms the supporting structure for each conductive bump 52a in the finished microelectronic structure. As shown in FIG. 12D, the bump-forming layer 66 is then developed or etched to define the conductive bump structure 99 on that portion of the UBM 60, which overlies the bond pad 58. The etching process also removes the remaining portion of the bump-forming layer 66 material from the UBM 60. The conductive bump structure 99 includes an upper surface 66a and sidewalls 68.

Figure 12E:
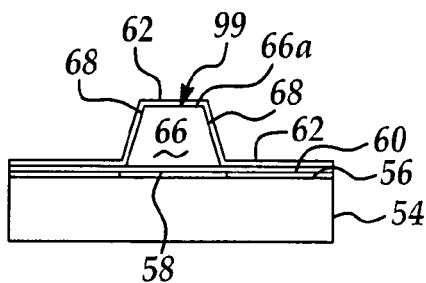
Figure 12F:
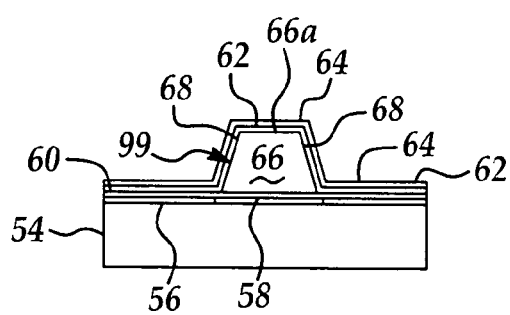

As shown in FIG. 12E, an adhesion layer 62 is then deposited on the upper surface 66a and sidewalls 68 of the bump structure 99. A conductive layer 64 is then deposited on the adhesion layer 62, as shown in FIG. 12F. The adhesion layer 62 and conductive layer 64 are typically formed by conventional sputtering techniques known by those skilled in the art.

Figure 12G:
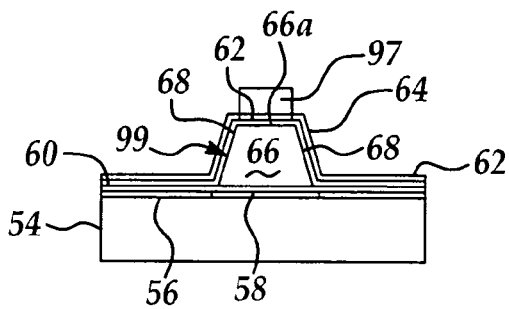

As shown in FIG. 12G, a patterned photoresist layer 97 is next deposited on the conductive layer 64 provided on the upper surface 66a of the bump structure 99. The photoresist layer 97 covers the areas of the conductive layer 64 and underlying adhesion layer 62 on the upper surface 66a and exposes the areas of the conductive layer 64 and adhesion layer 62 that cover the sidewalls 68.

Figure 12H:
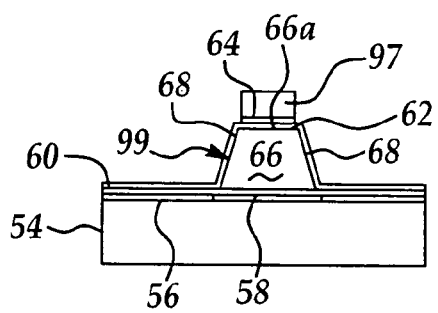
Figure 12I:
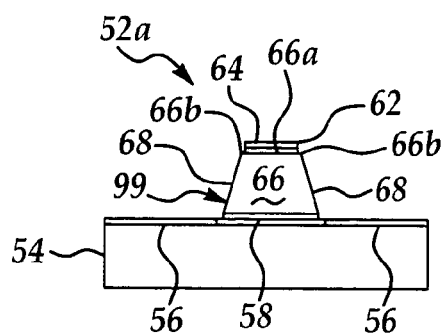

As shown in FIG. 12H, the portions of the conductive layer 64 and underlying adhesion layer 62 that are not covered by the photoresist 67 are then etched from the sidewalls 68 of the bump structure 99. Accordingly, as shown in FIG. 12I, the adhesion layer 62 and conductive layer 64 remain on the upper surface 66a of the conductive bump 52a, whereas the sidewalls 68 are exposed and uncovered by the adhesion layer 62 and conductive layer 64. Furthermore, by using a photoresist layer 97 (FIG. 12G) which is narrower than the upper surface 66a of the conductive bump 52a, as shown, at least one shoulder 66b is provided in the conductive layer 64 and adhesion layer 62, at the edges of the upper surface 66a.

While the preferred embodiments of the invention have been described above, it will be recognized and understood that various modifications can be made in the invention and the appended claims are intended to cover all such modifications which may fall within the spirit and scope of the invention.

What is claimed is:

1. A microelectronic structure, comprising:
a substrate comprising circuits;
a plurality of bumps provided on the substrate, each of the plurality of bumps being electrically insulative and having an upper surface, a pair of sidewalls, an outer wall facing away a center portion of the substrate and an inner wall facing towards the center portion of the substrate and connected to the outer wall by the pair of sidewalls; and
a conductive layer provided over each of the plurality of bumps extending from the upper surface to the circuits, wherein the conductive layer is absent from at least one of the pair of sidewalls of each of the plurality of bumps.

2. The microelectronic structure of claim 1, wherein the conductive layer is absent from both of the pair of sidewalls.

3. The microelectronic structure of claim 1, further comprising at least one shoulder provided in the conductive layer at the upper surface.

4. The microelectronic structure of claim 1, wherein the conductive layer is absent from the inner wall.

5. The microelectronic structure of claim 4, wherein the conductive layer is absent from both of the pair of sidewalls.

6. The microelectronic structure of claim 4, further comprising at least one should provided in the conductive layer at the upper surface.

7. The microelectronic structure of claim 1, wherein the conductive layer is formed of a conductive metal selected from the group consisting of Au, Ag, Pt, Pd, Al, Cu, Sn and alloys thereof.

8. The microelectronic structure of claim 7, wherein the conductive layer is absent from both of the pair of sidewalls.

9. The microelectronic structure of claim 7, further comprising at least one shoulder provided in the conductive layer at the upper surface.

10. A microelectronic structure, comprising:
a substrate comprising circuits;
a plurality of bumps provided in rows on the substrate, each of the plurality of bumps being electrically insulative and having an upper surface, a pair of sidewalls, an outer wall facing away a center portion of the substrate and an inner wall facing towards the center portion of the substrate and connected to the outer wall by the pair of sidewalls;
a conductive layer provided over each of the plurality of bumps extending from the upper surface to the circuits, wherein the conductive layer is absent from at least one of the pair of sidewalls of each of the plurality of bumps; and a protection layer provided on the substrate near the rows of the plurality of bumps.

11. The microelectronic structure of claim 10, wherein the conductive layer is absent from both of the pair of sidewalls.

12. The microelectronic structure of claim 10, wherein the conductive layer is absent from the inner wall.

13. The microelectronic structure of claim 10, further comprising a pad provided on the substrate near one of the plurality of bumps and in electrical contact with the conductive layer.

14. A microelectronic structure, comprising:
a substrate comprising circuits;
a plurality of bumps formed on the substrate, each of the plurality of bumps being electrically insulative and having an upper surface and a side surface; and
a conductive layer formed over each of the plurality of bumps extending from the upper surface to the circuits, exposing at least one portion of the side surface of each of the plurality of bumps.

15. The microelectronic structure of claim 14, wherein the conductive layer exposes at least one portion of the upper surface.

16. The microelectronic structure of claim 14, wherein the plurality of bumps are formed in rows in a staggered pattern.

17. The microelectronic structure of claim 14, wherein the conductive layer exposes a portion of the side surface of one of the plurality of bumps that faces towards a center portion of the substrate.

18. The microelectronic structure of claim 14, wherein the conductive layer exposes at least one of the side surfaces of two immediately adjacent bumps of the plurality of bumps.

19. The microelectronic structure of claim 14, wherein the conductive layer extends from the upper surface via a portion of the side surface to the substrate and extends further over the substrate.

20. A semiconductor package, comprising:
a first substrate;
a plurality of conductive pads formed on the first substrate;
a microelectronic structure including:
a second substrate comprising circuits;
a plurality of bumps formed on the substrate corresponding to the plurality of conductive pads, each of the plurality of bumps being electrically insulative and having an upper surface and a side surface; and
a conductive layer formed over each of the plurality of bumps extending from the upper surface to the circuits, exposing at least one portion of the side surface of each of the plurality of bumps; and
a film disposed between the first substrate and the second substrate to facilitate connecting the plurality of bumps to the plurality of conductive pads.

21. The semiconductor package of claim 20, wherein the conductive layer exposes at least one portion of the upper surface.

22. The semiconductor package of claim 20, wherein the plurality of bumps are formed in rows in a staggered pattern.

23. The semiconductor package of claim 20, wherein the conductive layer exposes a portion of the side surface of one of the plurality of bumps that faces towards a center portion of the substrate.

24. The semiconductor package of claim 20, wherein the conductive layer exposes at least one of the side surfaces of two immediately adjacent bumps of the plurality of bumps.

25. The semiconductor package of claim 20, wherein the conductive layer extends from the upper surface via a portion of the side surface to the substrate and extends further over the substrate.

26. The semiconductor package of claim 20, wherein the film includes one of an anisotropic conducting film and a non-conductive film.

27. The semiconductor package of claim 20, wherein each of the plurality of bumps includes polyimide.

* * * * *